(12) United States Patent
Lin

(10) Patent No.: US 10,098,268 B2
(45) Date of Patent: Oct. 9, 2018

(54) ELECTROMAGNETIC WAVE SHIELDING TAPE USING NANOMATERIALS

(71) Applicant: ANDAQ TECHNOLOGY CO., LTD., Taipei (TW)

(72) Inventor: Ching-Feng Lin, Hsinchu County (TW)

(73) Assignee: ANDAQ TECHNOLOGY CO., LTD., Taipei (TW)

( * ) Notice: Subject to any disclaimer, the term of this patent is extended or adjusted under 35 U.S.C. 154(b) by 0 days.

(21) Appl. No.: 15/432,708

(22) Filed: Feb. 14, 2017

(65) Prior Publication Data

US 2017/0238447 A1    Aug. 17, 2017

(30) Foreign Application Priority Data

Feb. 15, 2016    (TW) .............................. 105104263 A

(51) Int. Cl.
*H05K 9/00* (2006.01)
*B32B 7/04* (2006.01)
*B32B 3/30* (2006.01)

(52) U.S. Cl.
CPC ............ *H05K 9/0081* (2013.01); *B32B 3/30* (2013.01); *B32B 7/04* (2013.01); *H05K 9/009* (2013.01); *B32B 2307/206* (2013.01); *B32B 2307/212* (2013.01); *B32B 2457/04* (2013.01)

(58) Field of Classification Search
CPC ...................................................... H05K 9/009
See application file for complete search history.

(56) References Cited

U.S. PATENT DOCUMENTS

| | | | | |
|---|---|---|---|---|
| 2009/0277680 | A1* | 11/2009 | Lee ........................ | B82Y 10/00 174/377 |
| 2010/0300744 | A1* | 12/2010 | Romanko ............ | H05K 9/0088 174/388 |
| 2016/0007510 | A1* | 1/2016 | Cheng .................. | H05K 9/0088 428/551 |
| 2016/0057901 | A1* | 2/2016 | Sargeant ................ | B32B 15/08 428/339 |

\* cited by examiner

*Primary Examiner* — Hung V Ngo

(74) *Attorney, Agent, or Firm* — Li & Cai Intellectual Property (USA) Office

(57) ABSTRACT

An electromagnetic wave shielding tape using nanomaterials includes a carrier substrate, a first nanostructure, a second nanostructure, and an insulating enclosing structure for enclosing the carrier substrate, the first nanostructure, and the second nanostructure. The carrier substrate has a first surface and a second surface opposite to the first surface. The first nanostructure is disposed on the first surface of the carrier substrate, and the second nanostructure is disposed on the second surface of the carrier substrate.

6 Claims, 4 Drawing Sheets

ELECTROMAGNETIC WAVE SHIELDING TAPE USING NANOMATERIALS

BACKGROUND OF THE INVENTION

1. Field of the Invention

The instant disclosure relates to an electromagnetic wave shielding tape, and more particularly to an electromagnetic wave shielding tape using nanomaterials.

2. Description of Related Art

In operation of an electronic device, a certain degree of electromagnetic field is generated, and electromagnetic fields generated by devices may interfere with each other or block each other, or normal operation of neighboring devices is affected. Therefore, if the electromagnetic fields generated by a circuit current are not shielded appropriately, the electromagnetic fields may interfere with each other, and is the quality of signal transmission is deteriorated, so that the devices cannot be operated normally.

As a manner for electronic devices to resist electromagnetic interference, an electromagnetic interference (EMI) shielding material is used as a shielding cover for resisting the electromagnetic interference. The principle of the electromagnetic interference shielding is to adopt a low-resistance conductive material, because the conductive material has a reflection and guiding effect on electromagnetic waves. According to the theory of electromagnetic wave shielding of metal materials, the electromagnetic shielding effect of the metal material is the sum of the reflection loss of the electromagnetic wave, the absorption loss of the electromagnetic wave and the loss of the electromagnetic wave in the shielding material.

Most commonly, a complete metal protection net formed by a conductive tape or conductive gasket is adopted, so that the electronic circuit is in a completely isolated space without being interfered by external electromagnetic waves or interfering with other electronic components. The commercially available products include: an aluminum tape, a copper foil tape, an EMI conductive tape, an EMI gasket, a double-sided tape and so on, and moreover, the products have the advantages of simple operation and being easy to be torn and pasted, and are widely used in LCD TVs, laptops, mobile phones, computers and so on.

SUMMARY OF THE INVENTION

One aspect of the instant disclosure relates to an electromagnetic wave shielding tape using nanomaterials.

One of the embodiments of the instant disclosure provides an electromagnetic wave shielding tape using nanomaterials, comprising: a carrier substrate, a first nanostructure, a second nanostructure, and an insulating enclosing structure for enclosing the carrier substrate, the first nanostructure, and the second nanostructure. The carrier substrate has a first surface and a second surface opposite to the first surface. The first nanostructure is disposed on the first surface of the carrier substrate, and the second nanostructure is disposed on the second surface of the carrier substrate.

More precisely, the carrier substrate is a metal plate or a metal foil, the carrier substrate has a plurality of first micro concave areas and a plurality of second micro concave areas, the first micro concave areas are arranged as a first predetermined pattern disposed on the first surface of the carrier substrate, the second micro concave areas are arranged as a second predetermined pattern disposed on the second surface of the carrier substrate, and the first predetermined pattern and the second predetermined pattern are the same or different, wherein the first nanostructure includes a plurality of first nanostructure groups disposed on the first surface of the carrier substrate and a first filling covering body disposed on the first surface of the carrier substrate to cover the first nanostructure groups, the first nanostructure groups are respectively disposed on the first micro concave areas and respectively extended outwardly from the first micro concave areas, and each first nanostructure group has at least one first nanotube or at least one first nanosheet, wherein the second nanostructure includes a plurality of second nanostructure groups disposed on the second surface of the carrier substrate and a second filling covering body disposed on the second surface of the carrier substrate to cover the second nanostructure groups, the second nanostructure groups are respectively disposed on the second micro concave areas and respectively extended outwardly from the second micro concave areas, and each second nanostructure group has at least one second nanotube or at least one second nanosheet, wherein the insulating enclosing structure includes a first insulating enclosing layer and a second insulating enclosing layer mated with each other.

More precisely, the at least one first nanotube or the at least one first nanosheet is substantially vertical to the first surface of the carrier substrate, and the first nanostructure groups are arranged according to the first predetermined pattern to form a first layout pattern substantially the same or similar to the first predetermined pattern, wherein the at least one second nanotube or the at least one second nanosheet is substantially vertical to the second surface of the carrier substrate, and the second nanostructure groups are arranged according to the second predetermined pattern to form a second layout pattern substantially the same or similar to the second predetermined pattern.

More precisely, the at least one first nanotube or the at least one first nanosheet is inclined relative to the first surface of the carrier substrate by a first predetermined angle, and the first nanostructure groups are arranged according to the first predetermined pattern to form a first layout pattern substantially the same or similar to the first predetermined pattern, wherein the at least one second nanotube or the at least one second nanosheet is inclined relative to the second surface of the carrier substrate by a second predetermined angle, and the second nanostructure groups are arranged according to the second predetermined pattern to form a second layout pattern substantially the same or similar to the second predetermined pattern.

More precisely, the carrier substrate is a metal plate or a metal foil, the first nanostructure includes at least one first nanostructure coating layer disposed on the first surface of the carrier substrate or a plurality of first nanostructure coating layers stacked on top of one another and disposed on the first surface of the carrier substrate, and the second nanostructure includes at least one second nanostructure coating layer disposed on the second surface of the carrier substrate or a plurality of second nanostructure coating layers stacked on top of one another and disposed on the second surface of the carrier substrate, wherein the insulating enclosing structure includes a first insulating enclosing layer and a second insulating enclosing layer mated with each other.

More precisely, the carrier substrate is a polymer network structure, the first nanostructure includes at least one first nanostructure coating layer disposed on the first surface of the carrier substrate or a plurality of first nanostructure coating layers stacked on top of one another and disposed on the first surface of the carrier substrate, and the second nanostructure includes at least one second nanostructure coating layer disposed on the second surface of the carrier substrate or a plurality of second nanostructure coating layers stacked on top of one another and disposed on the second surface of the carrier substrate, wherein the insulating enclosing structure includes a first insulating enclosing layer and a second insulating enclosing layer mated with each other.

Another one of the embodiments of the instant disclosure provides an electromagnetic wave shielding tape using nanomaterials, comprising: a first nanostructure and an insulating enclosing structure for enclosing the first nanostructure.

More precisely, the first nanostructure includes at least one sheet nanomaterial layer or a plurality of sheet nanomaterial layers stacked on top of one another, and the insulating enclosing structure includes a first insulating enclosing layer and a second insulating enclosing layer mated with each other.

More precisely, the first nanostructure includes at least one mesh nanomaterial layer or a plurality of mesh nanomaterial layers stacked on top of one another, and the insulating enclosing structure includes a first insulating enclosing layer and a second insulating enclosing layer mated with each other.

Yet another one of the embodiments of the instant disclosure provides an electromagnetic wave shielding tape using nanomaterials, comprising: a first carrier substrate, a second carrier substrate connected with the first carrier substrate to form an insulating enclosing structure, a first nanostructure disposed on the first carrier substrate, a second nanostructure disposed on the second carrier substrate, and an adhesive layer disposed between the first nanostructure and the second nanostructure. More precisely, the first nanostructure and the second nanostructure are enclosed by the insulating enclosing structure, both the first carrier substrate and the second carrier substrate are polymer substrates, and both the first nanostructure and the second nanostructure are wave-absorbing material layers.

Therefore, the electromagnetic wave shielding tape using nanomaterials can provide an electromagnetic wave protection or a static electricity protection due to the design of "the first nanostructure disposed on the first surface of the carrier substrate, the second nanostructure disposed on the second surface of the carrier substrate, and the insulating enclosing structure enclosing the carrier substrate, the first nanostructure, and the second nanostructure", "the insulating enclosing structure enclosing the first nanostructure", or "the first nanostructure disposed on the first carrier substrate, the second nanostructure disposed on the second carrier substrate, the adhesive layer disposed between the first nanostructure and the second nanostructure, and the first nanostructure and the second nanostructure enclosed by the insulating enclosing structure".

To further understand the techniques, means and effects of the instant disclosure applied for achieving the prescribed objectives, the following detailed descriptions and appended drawings are hereby referred to, such that, and through which, the purposes, features and aspects of the instant disclosure can be thoroughly and concretely appreciated. However, the appended drawings are provided solely for reference and illustration, without any intention to limit the instant disclosure.

BRIEF DESCRIPTION OF THE DRAWINGS

The accompanying drawings are included to provide a further understanding of the instant disclosure, and are incorporated in and constitute a part of this specification. The drawings illustrate exemplary embodiments of the instant disclosure and, together with the description, serve to explain the principles of the instant disclosure.

DETAILED DESCRIPTION OF THE PREFERRED EMBODIMENTS

The embodiments of "an electromagnetic wave shielding tape using nanomaterials" of the instant disclosure are described. Other advantages and objectives of the instant disclosure can be easily understood by one skilled in the art from the disclosure. The instant disclosure can be applied in different embodiments. Various modifications and variations can be made to various details in the description for different applications without departing from the scope of the instant disclosure. The drawings of the instant disclosure are provided only for simple illustrations, but are not drawn to scale and do not reflect the actual relative dimensions. The following embodiments are provided to describe in detail the concept of the instant disclosure, and are not intended to limit the scope thereof in any way.

First Embodiment

Figure 1:
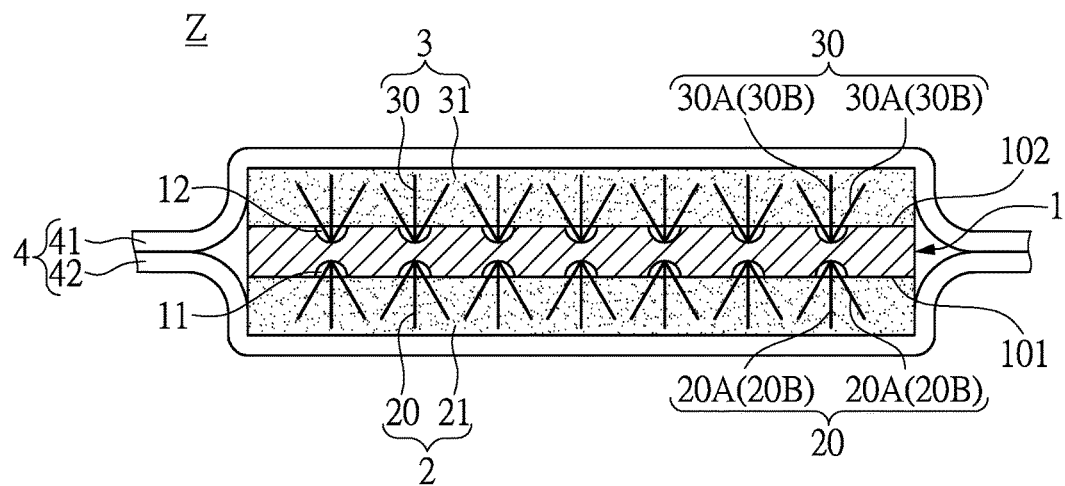
FIG. 1 shows a lateral, cross-sectional, schematic view of the electromagnetic wave shielding tape using nanomaterials according to the first embodiment of the instant disclosure.

Referring to FIG. 1, FIG. 1 shows a lateral, cross-sectional, schematic view of the electromagnetic wave shielding tape using nanomaterials according to the first embodiment of the instant disclosure, the first embodiment of the instant disclosure provides an electromagnetic wave shielding tape Z using nanomaterials, comprising a carrier substrate 1, a first nanostructure 2, a second nanostructure 3 and an insulating enclosing structure 4. The carrier substrate 1 has a first surface 101 and a second surface 102 opposite to the first surface 101. The first nanostructure 2 is disposed on the first surface 101 of the carrier substrate 1, and the second nanostructure 3 is disposed on the second surface 102 of the carrier substrate 1. The insulating enclosing structure 4 includes a first insulating enclosing layer 41 and a second insulating enclosing layer 42 mated with each other, and the carrier substrate 1, the first nanostructure 2 and the second nanostructure 3 are enclosed by the insulating enclosing structure 4.

More precisely, the carrier substrate 1 has a plurality of first micro concave areas 11 and a plurality of second micro concave areas 12, the first micro concave areas 11 are arranged as a first predetermined pattern disposed on the first surface 101, the second micro concave areas 12 are arranged as a second predetermined pattern disposed on the second surface 102, and the first predetermined pattern and the second predetermined pattern may be the same or different.

In addition, the first nanostructure 2 includes a plurality of first nanostructure groups 20 disposed on the first surface 101 of the carrier substrate 1 and a first filling covering body 21 disposed on the first surface 101 of the carrier substrate 1 to cover the first nanostructure groups 20. The first nanostructure groups 20 are respectively disposed on the first micro concave areas 11 and respectively extended outwardly from the first micro concave areas 11, and each first nanostructure group 20 has at least one first nanotube 20A or at least one first nanosheet 20B.

Moreover, the second nanostructure 3 includes a plurality of second nanostructure groups 30 disposed on the second surface 102 of the carrier substrate 1 and a second filling covering body 31 disposed on the second surface 102 of the carrier substrate 1 to cover the second nanostructure groups 30. The second nanostructure groups 30 are respectively disposed on the second micro concave areas 12 and respectively extended outwardly from the second micro concave areas 12, and each second nanostructure group 30 has at least one second nanotube 30A or at least one second nanosheet 30B.

Figure 2:
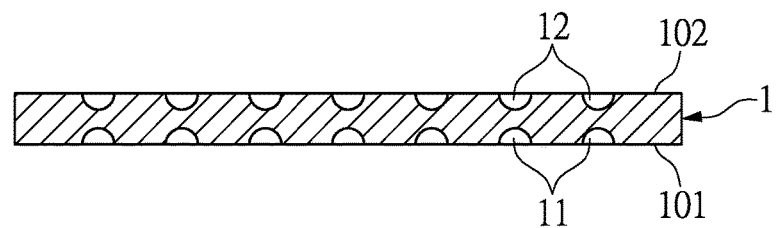
FIG. 2 shows a lateral, cross-sectional, schematic view of the carrier substrate of the electromagnetic wave shielding tape using nanomaterials according to the first embodiment of the instant disclosure.
Figure 3:
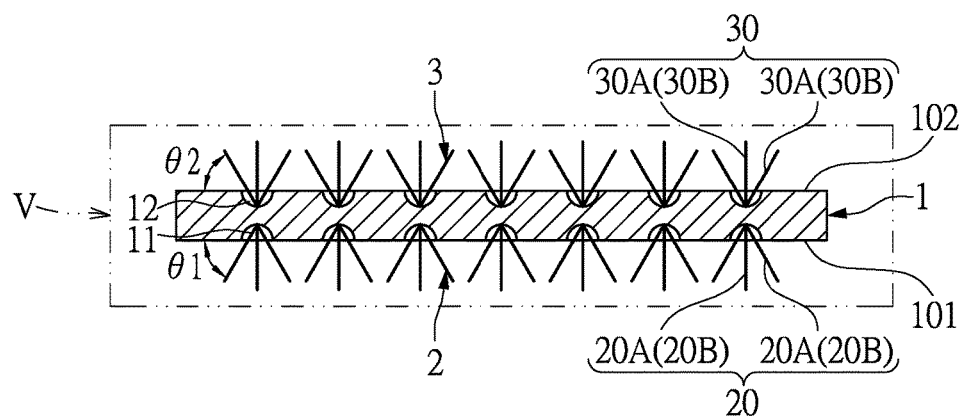
FIG. 3 shows a lateral, cross-sectional, schematic view of the first and the second nanostructures respectively disposed on two opposite surfaces of the carrier substrate of the electromagnetic wave shielding tape using nanomaterials according to the first embodiment of the instant disclosure.

Referring to FIG. 2 and FIG. 3, FIG. 2 shows a lateral, cross-sectional, schematic view of the carrier substrate of the electromagnetic wave shielding tape using nanomaterials according to the first embodiment of the instant disclosure, and FIG. 3 shows a lateral, cross-sectional, schematic view of the first and the second nanostructures respectively disposed on two opposite surfaces of the carrier substrate of the electromagnetic wave shielding tape using nanomaterials according to the first embodiment of the instant disclosure. The first embodiment of the instant disclosure provides a method of manufacturing the first nanostructure 2 and the second nanostructure 3, comprising the following steps:

First, referring to FIG. 2, providing a carrier substrate 1, wherein the carrier substrate 1 has a first surface 101 and a second surface 102 opposite to the first surface 101, the carrier substrate 1 has a plurality of first micro concave areas 11 and a plurality of second micro concave areas 12, the first micro concave areas 11 are arranged as a first predetermined pattern disposed on the first surface 101, and the second micro concave areas 12 are arranged as a second predetermined pattern disposed on the second surface 102. A couple of examples, the carrier substrate 1 may be a metal plate, a metal foil, or any other type of metal substrates, and the first predetermined pattern and the second predetermined pattern may be the same or different. Another example, the first predetermined pattern and the second predetermined pattern can be shown as two same matrix patterns according to different requirements.

Next, referring to FIG. 2, and FIG. 3, respectively forming a first nanostructure 2 and a second nanostructure 3 on the first surface 101 and the second surface 102 of the carrier substrate 1. The first nanostructure 2 includes a plurality of first nanostructure groups 20 respectively disposed on the first micro concave areas 11 and respectively extended outwardly (downwardly) from the first micro concave areas 11, and the second nanostructure 3 includes a plurality of second nanostructure groups 30 respectively disposed on the second micro concave areas 12 and respectively extended outwardly (upwardly) from the second micro concave areas 12.

More precisely, the step of respectively forming the first nanostructure 2 and the second nanostructure 3 on the first surface 101 and the second surface 102 of the carrier substrate 1 further comprises: first, coating a mixed solution (not shown) formed by mixing Fe, Co, Ni and metal salts (such as supersaturated metal salts) in the first micro concave areas 11 and the second micro concave areas 12 that are formed by physical or chemical processing; next, curing the mixed solution and placing the carrier substrate 1 into a vacuum chamber V; and then, as shown in FIG. 3, respectively forming the first nanostructure 2 and the second nanostructure 3 on the first surface 101 and the second surface 102 of the carrier substrate 1 in the vacuum chamber V. The first nanostructure groups 20 are arranged according to the first predetermined pattern to form a first layout pattern substantially the same or similar to the first predetermined pattern, and the second nanostructure groups 30 are arranged according to the second predetermined pattern to form a second layout pattern substantially the same or similar to the second predetermined pattern.

For example, as shown in FIG. 3, each first nanostructure group 20 has at least one first nanotube 20A or at least one first nanosheet 20B (there are three first nanotubes 20A or three first nanosheets 20B shown in FIG. 3 as an example), and each second nanostructure group 30 has at least one second nanotube 30A or at least one second nanosheet 30B (there are three second nanotubes 30A or three second nanosheets 30B shown in FIG. 3 as an example). More precisely, both the at least one first nanotube 20A and the at least one second nanotube 30A may be carbon nanotubes, and both the at least one first nanosheet 20B and the at least one second nanosheet 30B may be graphene nanosheets.

For example, as shown in FIG. 3, the at least one first nanotube 20A or the at least one first nanosheet 20B is substantially vertical to the first surface 101 of the carrier substrate 1, and the first nanostructure groups 20 are arranged according to the first predetermined pattern to form a first layout pattern substantially the same or similar to the first predetermined pattern. In addition, the at least one second nanotube 30A or the at least one second nanosheet 30B is substantially vertical to the second surface 102 of the carrier substrate 1, and the second nanostructure groups 30 are arranged according to the second predetermined pattern to form a second layout pattern substantially the same or similar to the second predetermined pattern.

For example, the at least one first nanotube 20A or the at least one first nanosheet 20B is inclined relative to the first surface 101 of the carrier substrate 1 by a first predetermined angle $\theta 1$, and the first nanostructure groups 20 are arranged according to the first predetermined pattern to form a first layout pattern substantially the same or similar to the first predetermined pattern. In addition, the at least one second nanotube 30A or the at least one second nanosheet 30B is inclined relative to the second surface 102 of the carrier substrate 1 by a second predetermined angle $\theta 2$, and the second nanostructure groups 30 are arranged according to the second predetermined pattern to form a second layout pattern substantially the same or similar to the second predetermined pattern.

Second Embodiment

Figure 4:
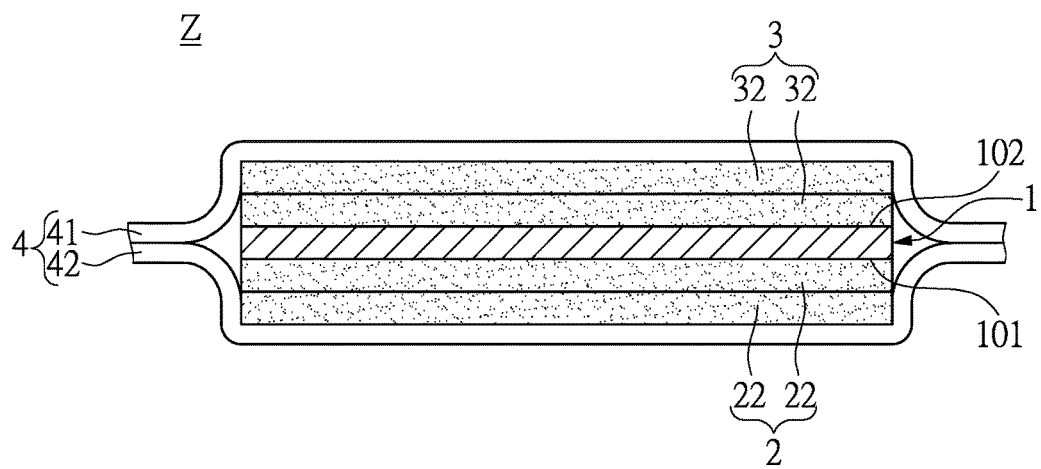
FIG. 4 shows a lateral, cross-sectional, schematic view of the electromagnetic wave shielding tape using nanomaterials according to the second embodiment of the instant disclosure.

Referring to FIG. 4, FIG. 4 shows a lateral, cross-sectional, schematic view of the electromagnetic wave shielding tape using nanomaterials according to the second embodiment of the instant disclosure, and the second embodiment of the instant disclosure provides an electromagnetic wave shielding tape Z using nanomaterials, comprising a carrier substrate 1, a first nanostructure 2, a second nanostructure 3 and an insulating enclosing structure 4. Comparing FIG. 4 with FIG. 1, the difference between the second embodiment and the first embodiment is as follows: in the second embodiment, the first nanostructure 2 includes at least one first nanostructure coating layer 22 disposed on the first surface 101 of the carrier substrate 1 or a plurality of first nanostructure coating layers 22 stacked on top of one another and disposed on the first surface 101 of the carrier substrate 1, and the second nanostructure 3 includes at least one second nanostructure coating layer 32 disposed on the second surface 102 of the carrier substrate 1 or a plurality of second nanostructure coating layers 32 stacked on top of one another and disposed on the second surface 102 of the carrier substrate 1.

For example, the second embodiment uses many first nanostructure coating layers 22 stacked on top of one another and disposed on the first surface 101 of the carrier substrate 1, and many second nanostructure coating layer 32 stacked on top of one another and disposed on the second surface 102 of the carrier substrate 1 shown in FIG. 4 as an example. In addition, both the first nanostructure coating layer 22 and the second nanostructure coating layer 32 are formed by sputtering.

Third Embodiment

Figure 5:
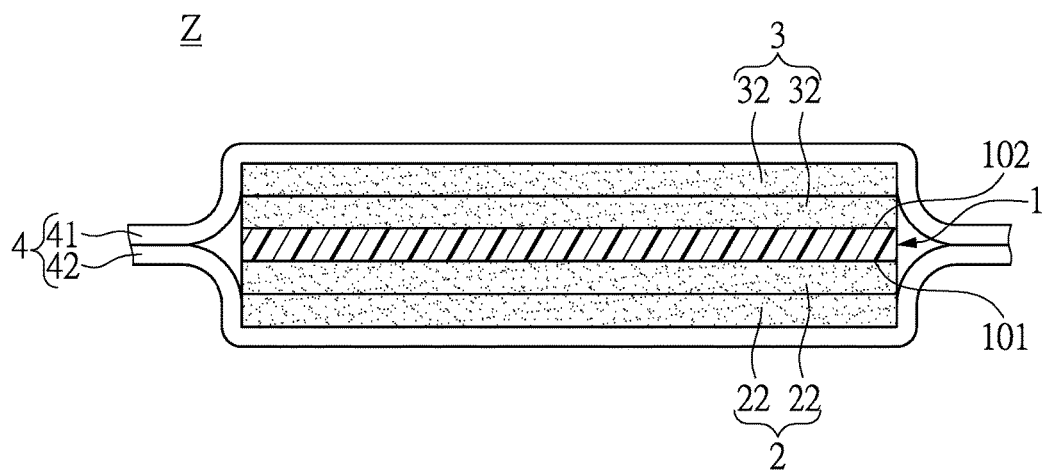
FIG. 5 shows a lateral, cross-sectional, schematic view of the electromagnetic wave shielding tape using nanomaterials according to the third embodiment of the instant disclosure.

Referring to FIG. 5, FIG. 5 shows a lateral, cross-sectional, schematic view of the electromagnetic wave shielding tape using nanomaterials according to the third embodiment of the instant disclosure, and the third embodiment of the instant disclosure provides an electromagnetic wave shielding tape Z using nanomaterials, comprising a carrier substrate 1, a first nanostructure 2, a second nanostructure 3 and an insulating enclosing structure 4. Comparing FIG. 5 with FIG. 1, the difference between the third embodiment and the first embodiment is as follows: in the third embodiment, the carrier substrate 1 may be a polymer network (or mesh) structure, the first nanostructure 2 includes at least one first nanostructure coating layer 22 disposed on the first surface 101 of the carrier substrate 1 or a plurality of first nanostructure coating layers 22 stacked on top of one another and disposed on the first surface 101 of the carrier substrate 1, and the second nanostructure 3 includes at least one second nanostructure coating layer 32 disposed on the second surface 102 of the carrier substrate 1 or a plurality of second nanostructure coating layers 32 stacked on top of one another and disposed on the second surface 102 of the carrier substrate 1.

For example, the third embodiment uses many first nanostructure coating layers 22 stacked on top of one another and disposed on the first surface 101 of the carrier substrate 1, and many second nanostructure coating layer 32 stacked on top of one another and disposed on the second surface 102 of the carrier substrate 1 shown in FIG. 5 as an example. In addition, both the first nanostructure coating layer 22 and the second nanostructure coating layer 32 are formed by coating.

Fourth Embodiment

Figure 6:
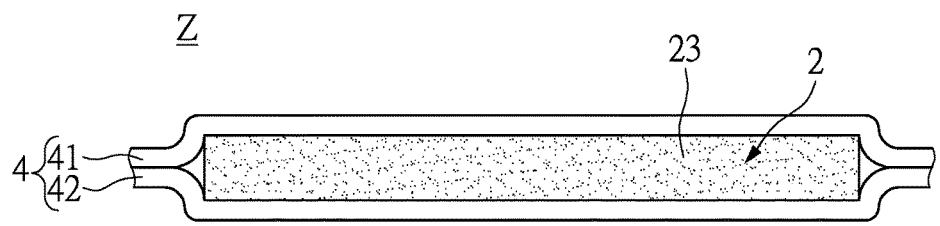
FIG. 6 shows a lateral, cross-sectional, schematic view of the electromagnetic wave shielding tape using nanomaterials according to the fourth embodiment of the instant disclosure.

Referring to FIG. 6, FIG. 6 shows a lateral, cross-sectional, schematic view of the electromagnetic wave shielding tape using nanomaterials according to the fourth embodiment of the instant disclosure, and the fourth embodiment of the instant disclosure provides an electromagnetic wave shielding tape Z using nanomaterials, comprising a first nanostructure 2 and an insulating enclosing structure 4, and the insulating enclosing structure 4 includes a first insulating enclosing layer 41 and a second insulating enclosing layer 42 mated with each other for enclosing the first nanostructure 2. More precisely, the first nanostructure 2 includes at least one sheet nanomaterial layer 23 (such as nanosheet material layer) or a plurality of sheet nanomaterial layers 23 stacked on top of one another. For example, the fourth embodiment uses a sheet nanomaterial layer 23 shown in FIG. 6 as an example. In addition, the sheet nanomaterial layer 23 may be a graphene nanosheet.

Fifth Embodiment

Figure 7:
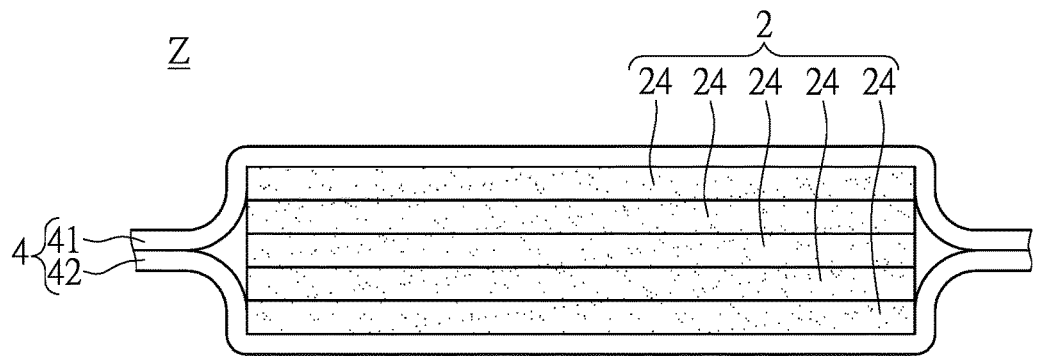
FIG. 7 shows a lateral, cross-sectional, schematic view of the electromagnetic wave shielding tape using nanomaterials according to the fifth embodiment of the instant disclosure.

Referring to FIG. 7, FIG. 7 shows a lateral, cross-sectional, schematic view of the electromagnetic wave shielding tape using nanomaterials according to the fifth embodiment of the instant disclosure, and the fifth embodiment of the instant disclosure provides an electromagnetic wave shielding tape Z using nanomaterials, comprising a first nanostructure 2 and an insulating enclosing structure 4, and the insulating enclosing structure 4 includes a first insulating enclosing layer 41 and a second insulating enclosing layer 42 mated with each other for enclosing the first nanostructure 2. More precisely, the first nanostructure 2 includes at least one mesh nanomaterial layer 24 (such as nanomesh material layer) or a plurality of mesh nanomaterial layers 24 stacked on top of one another. For example, the fifth embodiment uses many mesh nanomaterial layers 24 stacked on top of one another shown in FIG. 7 as an example. In addition, the mesh nanomaterial layer 24 may be a mesh structure weaved by nanomaterials such as graphene, carbon nanotube, carbon, metal nanowire, and metal nanoparticle.

Sixth Embodiment

Figure 8:
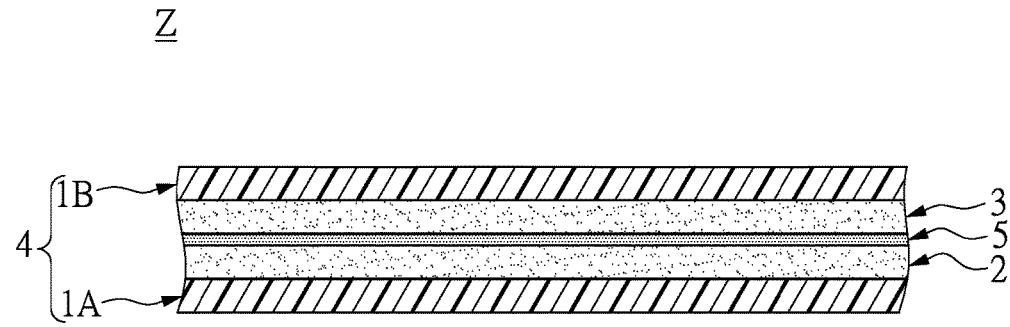
FIG. 8 shows a lateral, cross-sectional, schematic view of the electromagnetic wave shielding tape using nanomaterials according to the sixth embodiment of the instant disclosure.

Referring to FIG. 8, FIG. 8 shows a lateral, cross-sectional, schematic view of the electromagnetic wave shielding tape using nanomaterials according to the sixth embodiment of the instant disclosure, and the sixth embodiment of the instant disclosure provides an electromagnetic wave shielding tape Z using nanomaterials, comprising a first carrier substrate 1A, a second carrier substrate 1B, a first nanostructure 2, a second nanostructure 3, and an adhesive layer 5. The second carrier substrate 1B is connected with the first carrier substrate 1A to form an insulating enclosing structure 4. The first nanostructure 2 is disposed on the first carrier substrate 1A, and the second nanostructure 3 is disposed on the second carrier substrate 1B. The adhesive layer 5 is disposed between the first nanostructure 2 and the second nanostructure 3, and the first nanostructure 2 and the second nanostructure 3 are enclosed by the insulating enclosing structure 4. For example, both the first carrier substrate 1A and the second carrier substrate 1B are polymer substrates made of polymer materials, and both the first nanostructure 2 and the second nanostructure 3 are wave-absorbing material layers made of wave-absorbing materials including one or more metals (such as Fe, Ni, Al, Si, Zn etc.) or metal oxides (such as ferrite).

In conclusion, the electromagnetic wave shielding tape Z using nanomaterials can provide an electromagnetic wave protection or a static electricity protection due to the design of "the first nanostructure 2 disposed on the first surface 101 of the carrier substrate 1, the second nanostructure 3 disposed on the second surface 102 of the carrier substrate 1, and the insulating enclosing structure 4 enclosing the carrier substrate 1, the first nanostructure 2, and the second nanostructure 3", "the insulating enclosing structure 4 enclosing the first nanostructure 2", or "the first nanostructure 2 disposed on the first carrier substrate 1A, the second nanostructure 3 disposed on the second carrier substrate 1B, the adhesive layer 5 disposed between the first nanostructure 2 and the second nanostructure 3, and the first nanostructure 2 and the second nanostructure 3 enclosed by the insulating enclosing structure 4".

The aforementioned descriptions merely represent the preferred embodiments of the instant disclosure, without any intention to limit the scope of the instant disclosure which is fully described only within the following claims. Various equivalent changes, alterations or modifications based on the claims of the instant disclosure are all, consequently, viewed as being embraced by the scope of the instant disclosure.

What is claimed is:

1. An electromagnetic wave shielding tape using nanomaterials, comprising:
   a carrier substrate having a first surface and a second surface opposite to the first surface;
   a first nanostructure disposed on the first surface of the carrier substrate;
   a second nanostructure disposed on the second surface of the carrier substrate; and
   an insulating enclosing structure for enclosing the carrier substrate, the first nanostructure, and the second nanostructure;
   wherein the carrier substrate has a plurality of first micro concave areas and a plurality of second micro concave areas, the first micro concave areas are arranged as a first predetermined pattern disposed on the first surface of the carrier substrate, the second micro concave areas are arranged as a second predetermined pattern disposed on the second surface of the carrier substrate, and the first predetermined pattern and the second predetermined pattern are the same or different.

2. The electromagnetic wave shielding tape of claim 1, wherein the carrier substrate is a metal plate or a metal foil; wherein the first nanostructure includes a plurality of first nanostructure groups disposed on the first surface of the carrier substrate and a first filling covering body disposed on the first surface of the carrier substrate to cover the first nanostructure groups, the first nanostructure groups are respectively disposed on the first micro concave areas and respectively extended outwardly from the first micro concave areas, and each first nanostructure group has at least one first nanotube or at least one first nanosheet, wherein the second nanostructure includes a plurality of second nanostructure groups disposed on the second surface of the carrier substrate and a second filling covering body disposed on the second surface of the carrier substrate to cover the second nanostructure groups, the second nanostructure groups are respectively disposed on the second micro concave areas and respectively extended outwardly from the second micro concave areas, and each second nanostructure group has at least one second nanotube or at least one second nanosheet, wherein the insulating enclosing structure includes a first insulating enclosing layer and a second insulating enclosing layer mated with each other.

3. The electromagnetic wave shielding tape of claim 2, wherein the at least one first nanotube or the at least one first nanosheet is substantially vertical to the first surface of the carrier substrate, and the first nanostructure groups are arranged according to the first predetermined pattern to form a first layout pattern substantially the same or similar to the first predetermined pattern, wherein the at least one second nanotube or the at least one second nanosheet is substantially vertical to the second surface of the carrier substrate, and the second nanostructure groups are arranged according to the second predetermined pattern to form a second layout pattern substantially the same or similar to the second predetermined pattern.

4. The electromagnetic wave shielding tape of claim 2, wherein the at least one first nanotube or the at least one first nanosheet is inclined relative to the first surface of the carrier substrate by a first predetermined angle, and the first nanostructure groups are arranged according to the first predetermined pattern to form a first layout pattern substantially the same or similar to the first predetermined pattern, wherein the at least one second nanotube or the at least one second nanosheet is inclined relative to the second surface of the carrier substrate by a second predetermined angle, and the second nanostructure groups are arranged according to the second predetermined pattern to form a second layout pattern substantially the same or similar to the second predetermined pattern.

5. The electromagnetic wave shielding tape of claim 1, wherein the carrier substrate is a metal plate or a metal foil, the first nanostructure includes at least one first nanostructure coating layer disposed on the first surface of the carrier substrate or a plurality of first nanostructure coating layers stacked on top of one another and disposed on the first surface of the carrier substrate, and the second nanostructure includes at least one second nanostructure coating layer disposed on the second surface of the carrier substrate or a plurality of second nanostructure coating layers stacked on top of one another and disposed on the second surface of the carrier substrate, wherein the insulating enclosing structure includes a first insulating enclosing layer and a second insulating enclosing layer mated with each other.

6. The electromagnetic wave shielding tape of claim 1, wherein the carrier substrate is a polymer network structure, the first nanostructure includes at least one first nanostructure coating layer disposed on the first surface of the carrier substrate or a plurality of first nanostructure coating layers stacked on top of one another and disposed on the first surface of the carrier substrate, and the second nanostructure includes at least one second nanostructure coating layer disposed on the second surface of the carrier substrate or a plurality of second nanostructure coating layers stacked on top of one another and disposed on the second surface of the carrier substrate, wherein the insulating enclosing structure includes a first insulating enclosing layer and a second insulating enclosing layer mated with each other.

* * * * *